(12) United States Patent
Hou et al.

(10) Patent No.: US 11,882,747 B2
(45) Date of Patent: Jan. 23, 2024

(54) DISPLAY PANEL AND DISPLAY APPARATUS

(71) Applicant: WuHan TianMa Micro-electronics CO., LTD., Wuhan (CN)

(72) Inventors: Xueshun Hou, Wuhan (CN); Dongxu Xiang, Wuhan (CN); Yuan Li, Wuhan (CN); Tao Peng, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 376 days.

(21) Appl. No.: 17/138,790

(22) Filed: Dec. 30, 2020

(65) Prior Publication Data

US 2021/0118960 A1    Apr. 22, 2021

(30) Foreign Application Priority Data

Oct. 23, 2020    (CN) .......................... 202011149420.8

(51) Int. Cl.
*H10K 59/35*    (2023.01)
*H10K 59/65*    (2023.01)
*H10K 59/131*    (2023.01)

(52) U.S. Cl.
CPC ......... *H10K 59/353* (2023.02); *H10K 59/131* (2023.02); *H10K 59/65* (2023.02)

(58) Field of Classification Search
CPC ............ H01L 27/3216; H01L 27/3218; H10K 59/351–353
See application file for complete search history.

(56) References Cited

U.S. PATENT DOCUMENTS

| 9,935,155 | B2* | 4/2018 | Huangfu | G09G 3/2003 |
| 2008/0192162 | A1* | 8/2008 | Hayakawa | G02F 1/136204 |
| | | | | 349/42 |
| 2021/0134932 | A1* | 5/2021 | Chae | H10K 59/1216 |
| 2021/0408210 | A1* | 12/2021 | Kang | H10K 59/131 |
| 2022/0052147 | A1* | 2/2022 | Liu | H10K 59/1216 |

FOREIGN PATENT DOCUMENTS

CN    108873512 A    11/2018

\* cited by examiner

*Primary Examiner* — Eric K Ashbahian
(74) *Attorney, Agent, or Firm* — CHRISTENSEN O'CONNOR JOHNSON KINDNESS PLLC

(57) ABSTRACT

Provided are a display panel and a display apparatus. The display panel includes a normal display region and a functional region. The normal display region includes a first display region, a second display region and a third display region. Along a first direction, lengths of third, first and second display regions of the normal display region decrease. One of the first and third display regions is a specific display region where first semiconductor pattern layers are located. The first semiconductor pattern layers are arranged along a third direction and connected to each other. In the second display region, the second semiconductor pattern layers first semiconductor pattern layers is arranged along a third direction and connected to each other. The second semiconductor pattern layers are connected to the first semiconductor pattern layers.

17 Claims, 12 Drawing Sheets

DISPLAY PANEL AND DISPLAY APPARATUS

CROSS-REFERENCE TO RELATED DISCLOSURES

The present application claims priority to Chinese Patent Disclosure No. 202011149420.8, filed on Oct. 23, 2020, the content of which is incorporated herein by reference in its entirety.

TECHNICAL FIELD

The present disclosure relates to the field of display technology, and particularly, to a display panel and a display apparatus.

BACKGROUND

With the increasing of consumer demand, the full-screen display has gradually become the mainstream display technology. In the current full-screen display, a light-transmitting region is usually provided in the display region and optical devices are provided in the light-transmitting region. No light-transmitting region is provided in the non-display region, and thus a frame of the display screen is narrowed, thereby achieving the full-screen display. However, due to the presence of the light-transmitting region in the display region, the display effect of the display panel is deteriorated.

SUMMARY

In one aspect, the present disclosure provides a display panel. The display panel includes a normal display region including a first display region, a second display region and a third display region, and a functional region. Along a first direction, a length of the second display region is smaller than a length of the first display region and smaller than a length of the third display region, and the length of the first display region is smaller than the length of the third display region. A density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction. One of the first display region and the third display region is a specific display region, a plurality of first pixel circuits is located in the specific display region, a plurality of first semiconductor pattern layers is provided in the plurality of first pixel circuits in one-to-one correspondence, the plurality of first semiconductor pattern layers is arranged along a third direction and connected to each other, and a first angle α included between the third direction and the first direction satisfies $90°>α≥0°$. A plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$. The plurality of second semiconductor pattern layers that is arranged along the fourth direction and connected to each other is connected to the plurality of first semiconductor pattern layers that is arranged along the third direction and connected to each other.

In another aspect, the present disclosure provides a display apparatus. The display apparatus includes an optical device and a display panel. The display panel includes a normal display region including a first display region, a second display region and a third display region, and a functional region. Along a first direction, a length of the second display region is smaller than a length of the first display region and smaller than a length of the third display region, and the length of the first display region is smaller than the length of the third display region. A density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction. One of the first display region and the third display region is a specific display region, a plurality of first pixel circuits is located in the specific display region, a plurality of first semiconductor pattern layers is provided in the plurality of first pixel circuits in one-to-one correspondence, the plurality of first semiconductor pattern layers is arranged along a third direction and connected to each other, and a first angle α included between the third direction and the first direction satisfies $90°>α≥0°$. A plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$. The plurality of second semiconductor pattern layers that is arranged along the fourth direction and connected to each other is connected to the plurality of first semiconductor pattern layers that is arranged along the third direction and connected to each other. The optical device is arranged at a position of the display apparatus corresponding to the functional region.

BRIEF DESCRIPTION OF DRAWINGS

In order to clearly explain technical solutions of embodiments of the present disclosure, the drawings of the embodiments are briefly described as below. The drawings described below are merely some of the embodiments of the present disclosure. Those skilled in the art can derive other drawings from these drawings.

DESCRIPTION OF EMBODIMENTS

For facilitating the understanding of the technical solution of the present disclosure, the embodiments of the present disclosure are described in detail as below.

It should be understood that the embodiments described below are merely some of, rather than all of the embodiments of the present disclosure.

The terms used in the embodiments of the present disclosure are merely for the purpose of describing specific embodiments, but not intended to limit the present disclosure. The singular forms of "a", "an" and "the" used in the embodiments of the present disclosure and the appended claims are also intended to indicate plural forms, unless clearly indicating others.

It should be understood that the term "and/or" used herein merely indicates a relationship describing associated objects, indicating three possible relationships. For example, the expression "A and/or B" indicates: A exists alone, both A and B exist, or B exists alone. In addition, the character "/" in this description generally means that the associated objects are in an "or" relationship.

In the present disclosure, it should be understood that the terms "substantially", "approximately", "roughly", and "about" described in the claims and embodiments of the present disclosure refer to a reasonable process operation range or tolerance range that can be generally agreed, rather than an exact value.

It should be understood that, although the terms first, second, third, etc. in the embodiments of the present disclosure are used to describe display region, these display regions should not be limited to these terms, and these terms are only used to distinguish the display regions from each other. For example, without departing from the scope of the embodiments of the present disclosure, the first display region can also be referred to as the second display region, and similarly, the second display region can also be referred to as the first display region.

Through careful and in-depth research, Applicant provides solutions to the problems existing in the related.

The embodiments of the present disclosure provide a display panel and a display apparatus.

Figure 1:
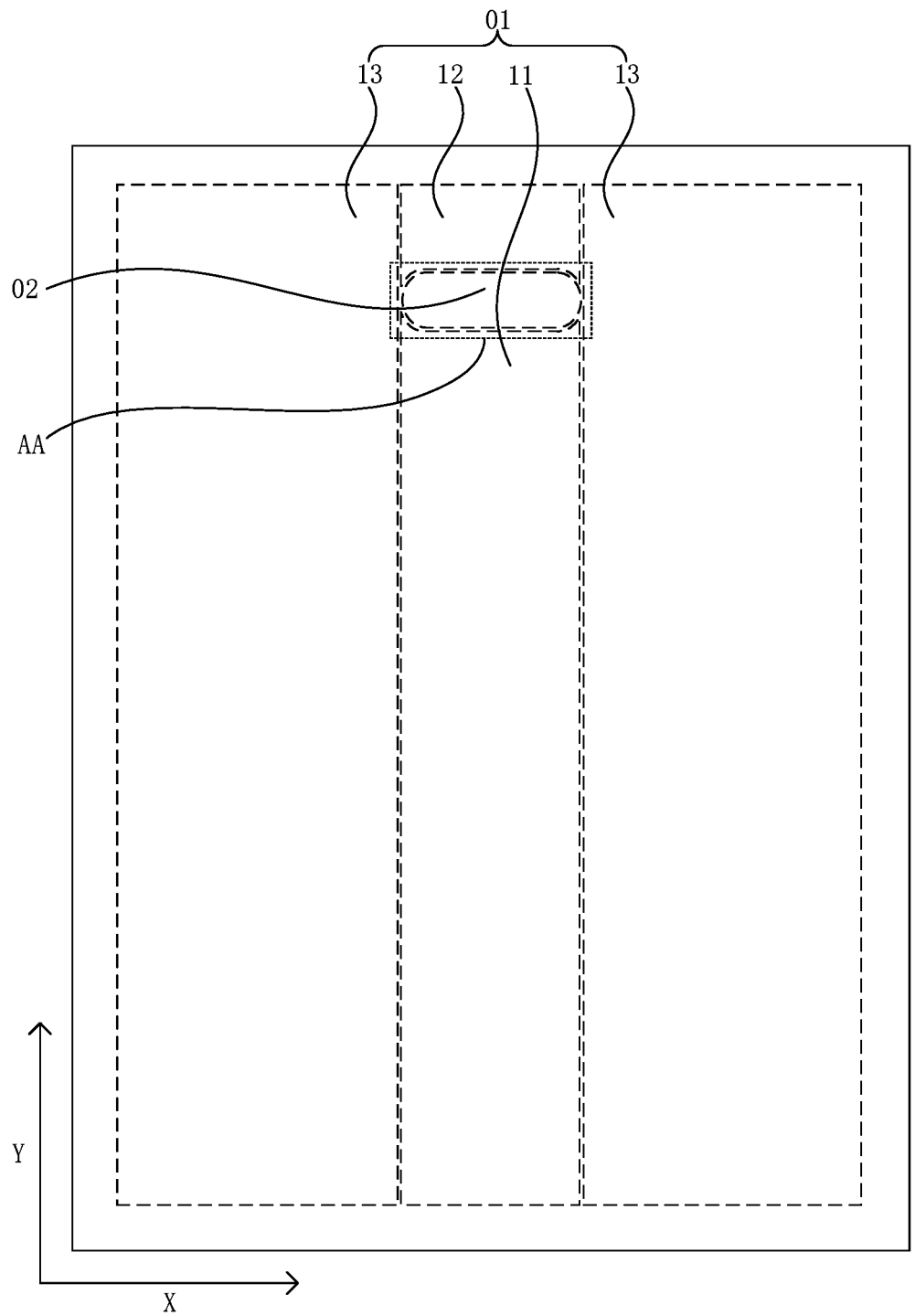
FIG. 1 is a schematic diagram of a display panel according to an embodiment of the present disclosure.
Figure 2:
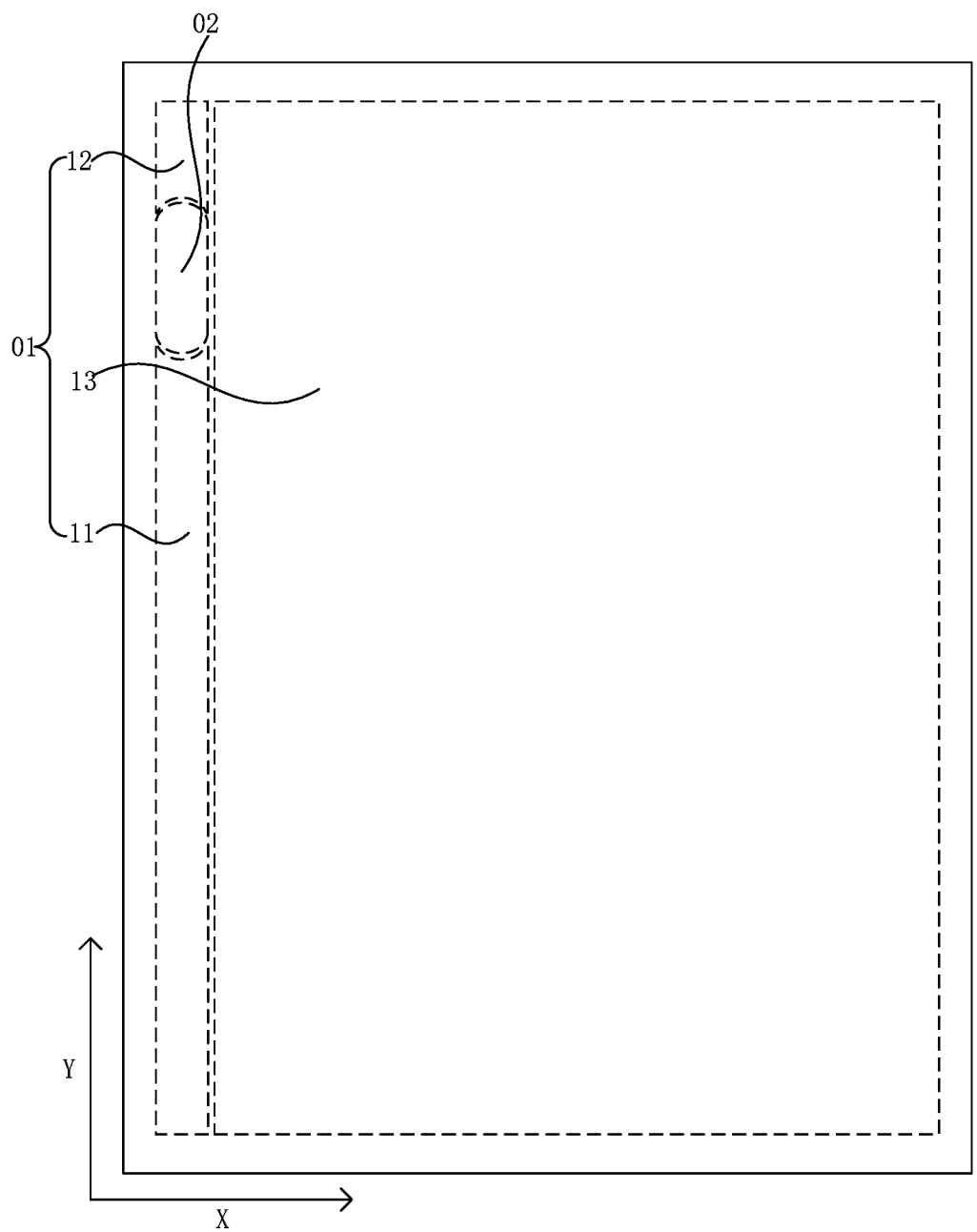
FIG. 2 is another schematic diagram of a display panel according to an embodiment of the present disclosure.
Figure 3:
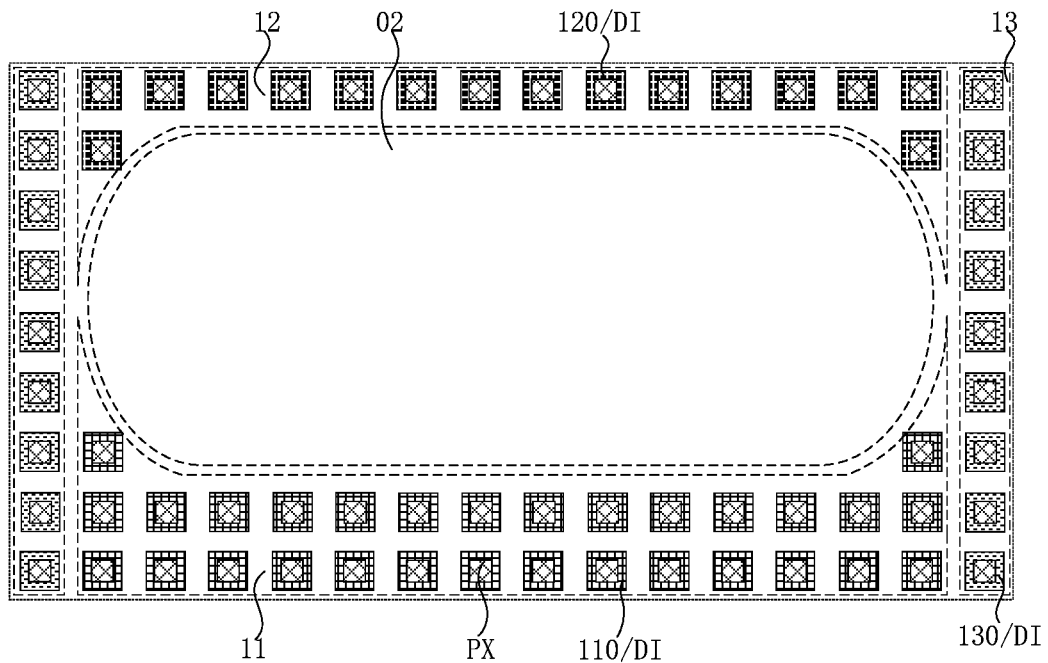
FIG. 3 is a partially enlarged view of an region AA shown in FIG. 1.
Figure 4:
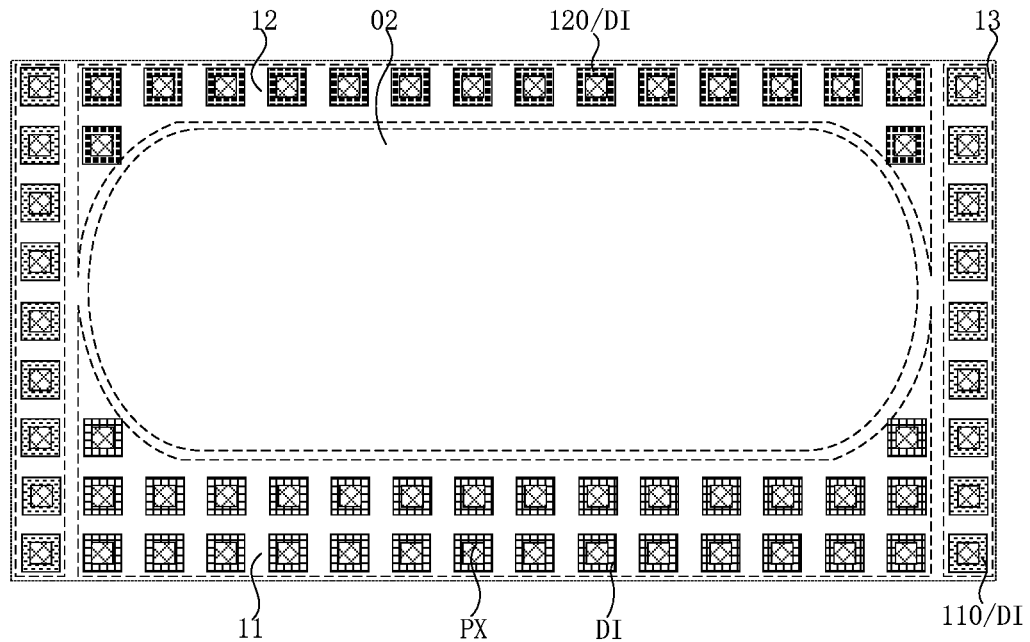
FIG. 4 is another partially enlarged view of an region AA shown in FIG. 1.

It has been found that, for the display panel where the light-transmitting region is provided in the display region, the light-transmitting region shall be provided with no or fewer light-shielding structures to ensure a light transmittance of the light-transmitting region. For example, when no or fewer metal wirings and semiconductor layers are provided in the light-transmitting region, the metal wirings and the semiconductor layers are disconnected in the light-transmitting region. Different lengths of upper and lower semiconductor layers in the light-transmitting region may result in an uneven static electricity distribution during the manufacturing of the semiconductor layer. For example, the semiconductor layer with a smaller length has a higher density of static electricity, and the semiconductor layer with a greater length has a lower density of static electricity. The manufacturing process of the semiconductor layer includes high-temperature processes such as annealing and activation processes, and the static electricity can irreversibly affect the performance of the semiconductor layer during the high-temperature process, thereby affecting the performance of the corresponding transistor such as a level of threshold voltage. Since the semiconductor layer is disconnected in the light-transmitting region, the static electricity on the semiconductor layer is unevenly distributed. The uneven distribution of static electricity has different irreversible effects on the performance of the semiconductor layer in the high temperature process, and thus the performances of the transistors in the display are different, which in turn leads to poor display uniformity of the display. FIG. 1 is a schematic diagram of a display panel provided by an embodiment of the present disclosure. FIG. 2 is another schematic diagram of a display panel provided by an embodiment of the present disclosure. FIG. 3 is a partial enlarged view of a region AA shown in FIG. 1. FIG. 4 is another partial enlarged view of region AA shown in FIG. 1. It should be noted that the specific structures located in the region AA illustrated in FIG. 3 and FIG. 4 are substantially the same as the specific structures near the functional region in FIG. 2.

As shown in FIG. 1 and FIG. 2, the display panel provided by an embodiment of the present disclosure includes a normal display region 01 and a functional region 02, and the normal display region 01 at least partially surrounds the functional region 02. As shown in FIG. 1, the functional region 02 is completely surrounded by the normal display region 01. As shown in FIG. 2, the functional region 02 is partially surrounded by the normal display region 01. As shown in FIG. 3 and FIG. 4, a plurality of sub-pixels PX emitting light are provided in the normal display region 01, for main light-emitting display. A density of sub-pixels located in the functional region 02 is lower than a density of sub-pixels located in the normal display region 01. The functional region 02 have the functions other than light-emitting display, such as at least one of taking pictures, recognizing biological features, and lighting. In an embodiment, in addition to these functions, the functional region 02 also has the function of light-emitting display.

Further referring to FIG. 1 and FIG. 2, the normal display region 01 includes a first display region 11, a second display region 12 and a third display region 13, which are three different regions of the normal display region 01 and can have the same sub-pixel PX design pattern. The second display region 12, the functional region 02, and the first display region 11 are sequentially arranged and adjacent to each other along a first direction Y. That is, along the first direction Y, the functional region 02 is arranged between the first display region 11 and the second display region 12. The functional region 02 and at least one of the first display region 11 or the second display region 12 are adjacent to the third display region 13 along the second direction X. That is, the first display region 11, the second display region 12, and the functional region 02 are aligned alone the first direction Y and they as a whole are adjacent to the third display region 13 in the second direction X. The first direction Y intersects the second direction X. In an embodiment, the first direction Y is perpendicular to the second direction X.

The second display region 12 has a smaller length along the first direction Y than both the first display region 11 and the third display region 13, and the first display region 11 has a smaller length along the first direction Y than the third display region 13. The functional region 02 is at least partially surrounded by the normal display region 01, i.e., the functional region 02 is provided within the normal display region 01, thereby avoiding an increase in a frame width when the functional region 02 is provided in the non-display region outside the normal display region 01.

The functional region 02 is usually arranged to be close to an edge of the display panel to avoid affecting the display effect of the normal display region 01. As used herein, the term "close to" means "adjacent to." As shown in FIG. 1 and FIG. 2, in the first direction Y, the functional region 02 is close to a side edge of the normal display region 01, and thus the first display region 11 and the second display region 12 that are located on both sides of the normal display region 01 along the first direction Y have different lengths. In addition, when the functional region 02 is arranged at a position close to the edge of the normal display region 01 in the first direction Y, the functional region 02 can be arranged in the middle of the normal display region 01 in the second direction X, as shown in FIG. 1, or the functional region 02 can be arranged close to an edge of the normal display region 01 in the second direction X, as shown in FIG. 2.

The length along the first direction Y of the first display region 11 refers to a length along the first direction Y of a region where the first display region 11 is located. The length along the first direction Y of the second display region 12 refers to a length along the first direction Y of a region where the second display region 12 is located. The length along the first direction Y of the third display region 13 refers to a length along the first direction Y of a region where the third display region 13 is located.

It should be noted that the functional region 02 can have a rectangular structure or a structure of other shapes. When the functional region 02 has a non-rectangular structure, the corresponding first display region 11, the second display region 12 and/or the third display region 13 also have a non-rectangular structure. In this regard, the length of the first display region 11, the length of the second display region 12, and the length of the third display region 13 in the present disclosure are referred to an average length of the first display region 11, an average length of the second display region 12, and an average length of the third display region 13, respectively.

Since the second display region 12 has a smaller length along the first direction Y than both the first display region 11 and the third display region 13, and the first display region 11 has a smaller length along the first direction Y than the third display region 13, a number of sub-pixels PX arranged along the first direction Y in the second display region 12 is smaller than both a number of sub-pixels PX arranged along the first direction Y in the first display region 11 and a number of sub-pixels arranged along the first direction Y in the third display region 13. In addition, the number of sub-pixels PX arranged along the first direction Y in the first display region 11 is an average number of the sub-pixels PX arranged in multiple columns along the first direction Y in the first display region 11. The number of sub-pixels PX arranged along the first direction Y in the second display region 12 is an average number of the sub-pixels PX arranged in multiple columns along the first direction Y in the second display region 12, and the number of sub-pixels PX arranged along the first direction Y in the third display region 13 is an average number of sub-pixels PX arranged in multiple columns along the first direction Y in the third display region 13.

In an embodiment of the present disclosure, the sub-pixels PX of the display panel can be self-luminous devices, such as organic light-emitting diodes or micro-diodes. As shown in FIG. 3, the display panel also includes pixel circuits DI corresponding to the sub-pixels PX in a one-to-one correspondence. The pixel circuit DI is configured to provide a corresponding sub-pixel with a voltage required for light emission.

Figure 5:
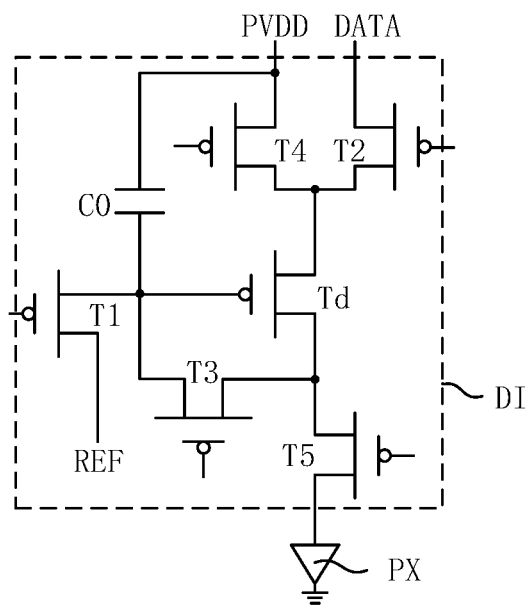
FIG. 5 is an equivalent circuit diagram of a pixel circuit provided by an embodiment of the present disclosure.

FIG. 5 is an equivalent circuit diagram of a pixel circuit provided by an embodiment of the present disclosure. As shown in FIG. 5, the pixel circuit DI and the sub-pixel PX are electrically connected to each other.

Further referring to FIG. 5, the pixel circuit DI includes a light-emission driving transistor Td, a reset transistor T1, a data voltage writing transistor T2, a threshold capturing transistor T3, a power supply voltage writing transistor T4, a light-emission control transistor T5, and a first capacitor C0. For the purpose of description, for example, all the light-emission driving transistor Td, the reset transistor T1, the data voltage writing transistor T2, the threshold capturing transistor T3, the power supply voltage writing transistor T4 and the light-emission control transistor T5 are P-type transistors. In other embodiments, the light-emission driving transistor Td, the reset transistor T1, the data voltage writing transistor T2, the threshold capturing transistor T3, the power supply voltage writing transistor T4 and the light-emission control transistor T5 can be N-type transistors. In another embodiment, at least one of the light-emission driving transistor Td, the reset transistor T1, the data voltage writing transistor T2, the threshold capturing transistor T3, the power supply voltage writing transistor T4, or the light-emission control transistor T5 is a P-type transistor and at least one thereof is an N-type transistor.

The reset transistor T1 has a source electrically connected to a reset signal line REF, and a drain electrically connected to a gate of the light-emission driving transistor Td. A source of the data voltage writing transistor T2 is electrically connected to a data signal line DATA, and a drain of the data voltage writing transistor T2 is electrically connected to a source of the light-emission driving transistor Td. A source of the threshold value capturing transistor T3 is electrically connected to a drain of the light-emission driving transistor Td, and a drain of the threshold value capturing transistor T3 is electrically connected to the gate of the light-emission driving transistor Td. A source of the power supply voltage writing transistor T4 is electrically connected to a power supply voltage line PVDD, and a drain of the power supply voltage writing transistor T4 is electrically connected to the source of the light-emission driving transistor Td. A source of the light-emission control transistor T5 is electrically connected to the drain of the light-emission driving transistor Td, and a drain of the light-emission control transistor T5 is electrically connected to a light emitting device EL. The capacitor C0 has a first plate electrically connected to the gate of the light-emission driving transistor Td, and a second plate electrically connected to the power supply voltage line PVDD.

The operation process of the pixel circuit shown in FIG. 5 will be described below. The operation process of the pixel circuit includes a reset phase, a data voltage writing phase, and a light-emitting phase.

In the reset phase, the reset transistor T1 is switched on, and the reset signal line REF transmits a reset signal, the reset signal is written into the gate of the light-emission driving transistor Td to reset the gate of the light-emission driving transistor Td, and the first capacitor C0 stores the reset signal.

In the data voltage writing phase, the power supply voltage writing transistor T4 and the light-emission control transistor T5 are switched off, the data voltage writing transistor T2 and the threshold capturing transistor T3 are switched on, and the data voltage is transmitted through the data signal line DATA; and as the potential of the data voltage is higher than the potential of the reset signal, the light-emission driving transistor Td is switched on and the data voltage is written into the gate of the light-emission driving transistor Td.

In the light-emitting phase, the threshold capturing transistor T3 is switched off, the power supply voltage writing transistor T4 and the light-emission control transistor T5 are switched on, and the power supply voltage line PVDD transmits the power supply voltage, and the power supply voltage is transmitted to the source of the light-emission driving transistor Td; and as the potential of the power supply voltage is greater than the potential of the data voltage, the light-emission driving transistor Td generates a light-emitting driving current and the light-emitting driving current is transmitted to the sub-pixel PX.

It should be noted that FIG. 5 only illustrates one of the equivalent circuit diagrams of the pixel circuit, and the specific structure of the pixel circuit in the present disclosure can also be in other forms.

Figure 6:
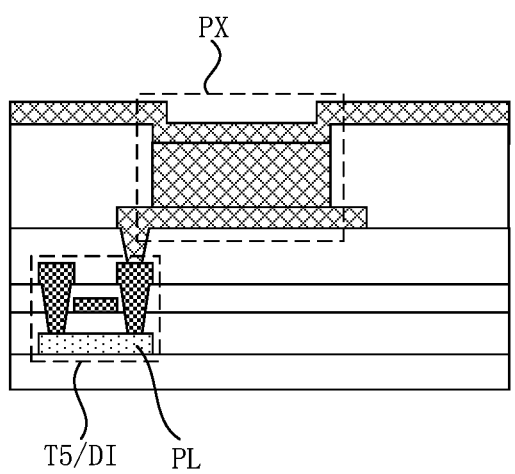
FIG. 6 is a cross-sectional view corresponding to a sub-pixel region provided by an embodiment of the present disclosure.

FIG. 6 is a cross-sectional view corresponding to a sub-pixel region in the present disclosure. In combination with FIG. 5 and FIG. 6, the pixel circuit DI that provides a light-emitting signal for a sub-pixel PX includes a plurality of transistors, and one of the plurality of transistors, such as a light-emission control transistor T5, is electrically connected to the sub-pixel PX. In order to realize a higher density of sub-pixels PX of the light-emitting display panel, the plurality of transistors of one pixel circuit DI is arranged as close as possible.

Figure 7:
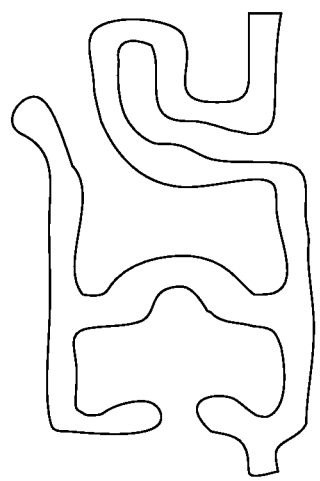
FIG. 7 is a schematic diagram of a semiconductor pattern layer corresponding to a pixel circuit according to an embodiment of the present disclosure.

FIG. 7 is a schematic diagram of a semiconductor pattern layer corresponding to a pixel circuit according to an embodiment of the present disclosure. Each of the plurality of transistors of one pixel circuit DI includes an active layer PL. Due to the limitation of process precision, the active layers PL of the plurality of transistors of one pixel circuit DI connected together to form the semiconductor pattern layer as shown in FIG. 7. It should be noted that FIG. 7 merely illustrates one type of semiconductor pattern layer corresponding to the pixel circuit DI, and other shapes of the semiconductor pattern layer corresponding to the pixel circuit DI are also possible.

Figure 8:
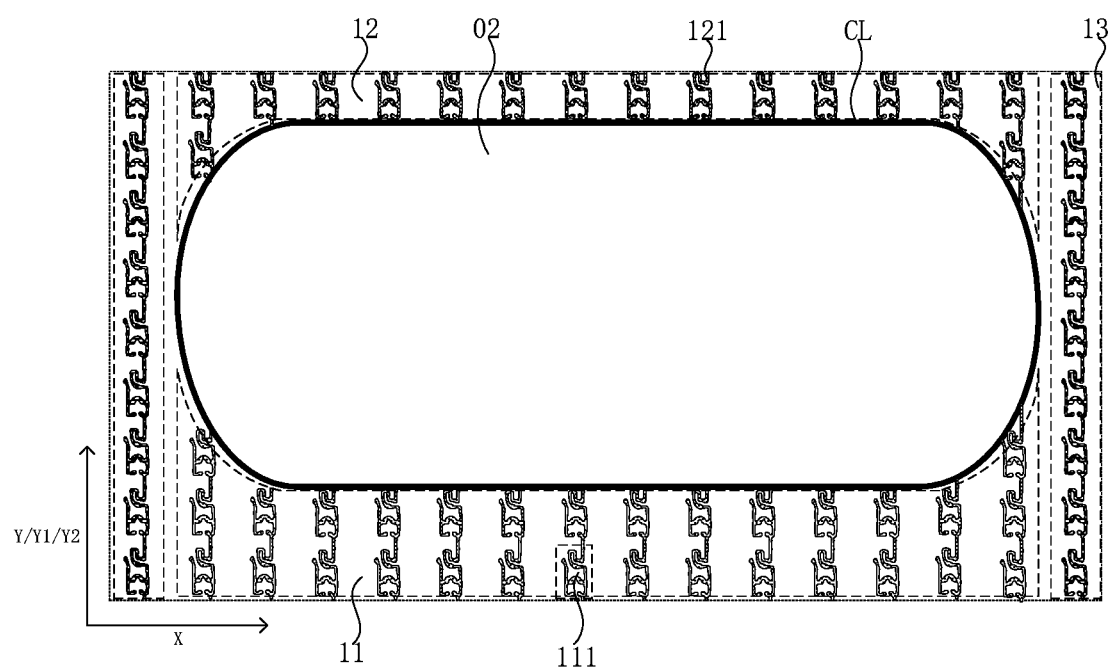
FIG. 8 is a schematic diagram of a layer where the semiconductor pattern layer corresponding to FIG. 3 is located.
Figure 9:
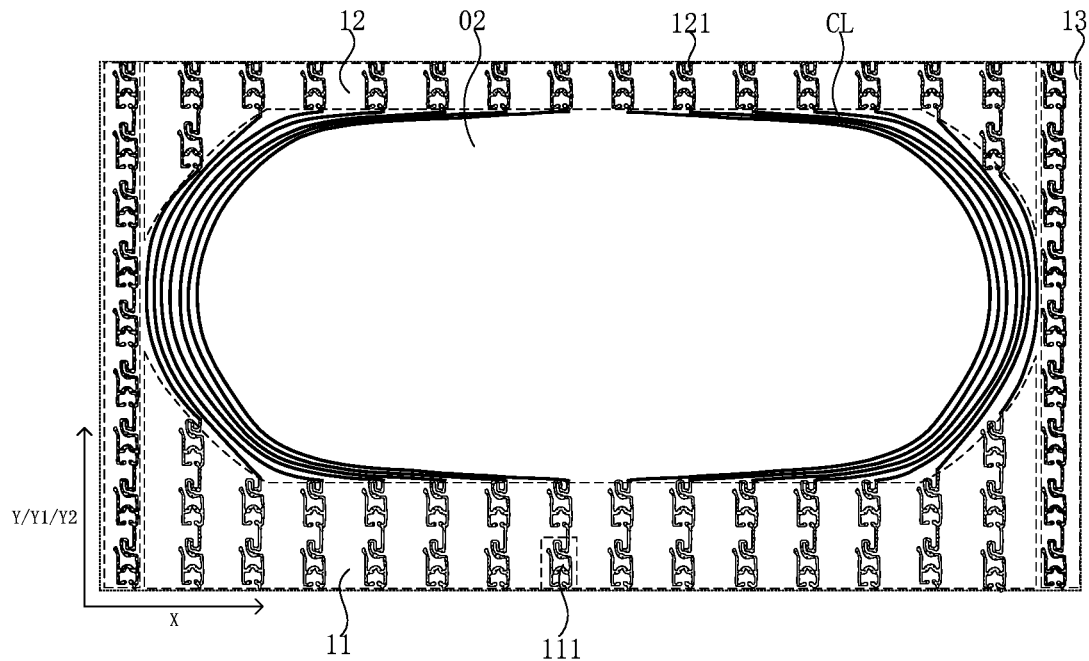
FIG. 9 is another schematic diagram of a layer where the semiconductor pattern layer corresponding to FIG. 3 is located.
Figure 10:
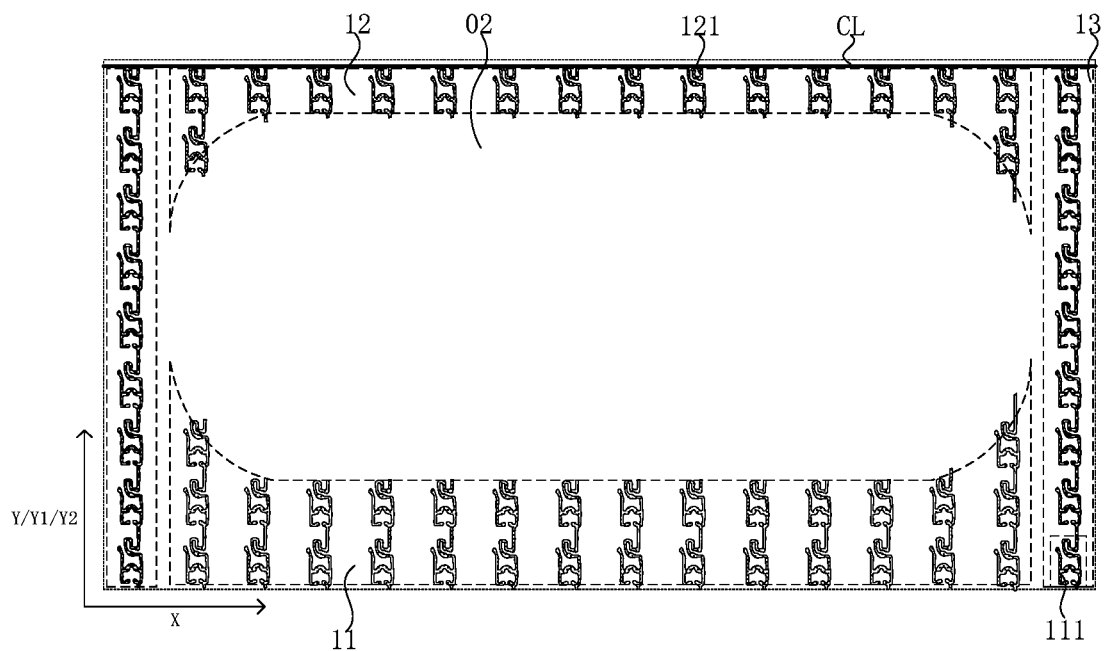
FIG. 10 is a schematic diagram of a layer where the semiconductor pattern layer corresponding to FIG. 4 is located.

FIG. 8 is a schematic diagram of a layer where the semiconductor pattern layer corresponding to FIG. 3 is located, FIG. 9 is another schematic diagram of a layer where the semiconductor pattern layer corresponding to FIG. 3 is located, and FIG. 10 is a schematic diagram of a layer where the semiconductor pattern layer corresponding to FIG. 4 is located.

In combination with FIG. 3, FIG. 8 and FIG. 9, and FIG. 4 and FIG. 10, one of the first display region 11 and the third display region 13 is a specific display region, in which the pixel circuits DI are first pixel circuits 110. Each of the first pixel circuits 110 includes a first semiconductor pattern layer 111. The first semiconductor pattern layers 111 are arranged along a third direction and connected to each other. A first included angle α is formed between the third direction and the first direction Y, where $90°>α≥0°$.

The pixel circuits DI in the second display region 12 are second pixel circuits 120, and each of the second pixel circuits 120 includes a second semiconductor pattern layer 121. The second semiconductor pattern layers 121 are arranged along a fourth direction and connected to each other. A second included angle β is formed between the fourth direction and the first direction Y, where $90°>β≥0°$.

The second semiconductor pattern layers 121 that are arranged along the fourth direction Y2 and connected to each other are connected to the first semiconductor pattern layers 111 that are arranged along the third direction Y1 and connected to each other.

In the present disclosure, by connecting the second semiconductor pattern layers 121 to the first semiconductor pattern layers 111, the semiconductor pattern layer in the functional region 02 is continuous, thereby reducing the risk of static electricity flowing into the semiconductor pattern layer located in the functional region 02. At the same time, the second semiconductor pattern layers 121 connected in series are connected to the first semiconductor pattern layers 111 connected in series, and thus the denser static electricity distributed on the second semiconductor pattern layer 121 is dispersed to the first semiconductor pattern layer 111 and the second semiconductor pattern layer 111, thereby achieving the uniform distribution of static electricity in the semiconductor pattern layer. Furthermore, the reliability and uniformity of the performance of the semiconductor pattern layer in the subsequent high-temperature manufacturing process can be improved, so that the ability of driving the pixel circuit is basically the same, the display uniformity of the display panel is realized, and the display effect is improved.

In an embodiment, a ratio of the length along the first direction Y of the second display region 12 to the length along the first direction Y of the specific display region is within a range from 12 to 50. When the length of different display regions is characterized with a number of pixel circuits, a number of first pixel circuits 110 arranged along the first direction Y in a specific display region is N, and the number of the second pixel circuits 120 arranged along the first direction Y is M, where both M and N are positive integers greater than or equal to 2, and $50≥N/M≥12$. When the length of the second display region 12 satisfies the above relationship, the position of the function region 02 has insignificant influence on the display effect of the display panel. However, if the second semiconductor pattern layers 121 in the second display region 12 are not connected to the first semiconductor pattern layers to dissipate the static electricity in the manufacturing process, the display effect in the second display region 12 is significantly different from that in other display regions. Therefore, when the ratio of the length along the first direction Y of the second display region 12 to the length along the first direction Y of the specific display region is within the range of 12 to 50, by applying the technical solution according to the present embodiment, in which the second semiconductor pattern layers 121 are connected to the first semiconductor pattern layer, the problem that the display effect in the second display region 12 is significantly different from that in other display regions can be effectively solved.

In an embodiment, the semiconductor pattern layer is made of one of polysilicon and metal oxide semiconductor. The pixel circuit adopting polysilicon as the semiconductor pattern layer has a faster response speed, and the pixel circuit adopting metal oxide semiconductor as the semiconductor pattern layer can generate a stable light-emitting current. Therefore, when the semiconductor pattern layer of the display panel is made of one of polysilicon and metal oxide semiconductor, the display panel has excellent light-emitting performance. At the same time, when the semiconductor pattern layer of the display panel is made of one of polysilicon and metal oxide semiconductor, the connection between the first semiconductor pattern layers 111 and the second semiconductor pattern layers 121 can effectively solve the problem that excessive static electricity accumulates in the semiconductor pattern layer in the specific display region.

In an embodiment, the third direction Y1 is parallel to the fourth direction Y2. That is, in a same direction, adjacent first semiconductor pattern layers 111 are connected to each other, and adjacent second semiconductor pattern layers 121 are connected to each other; and the first semiconductor pattern layer 111 and the second semiconductor pattern layer 121 that are connected to each other are also substantially arranged along the same direction.

In an embodiment of the present disclosure, both the third direction Y1 and the fourth direction Y2 are parallel to the first direction Y, i.e., $\alpha=0°$, $\beta=0°$. As shown in FIG. 7 to FIG. 9, the first semiconductor pattern layers 111 in the same column are sequentially connected, and the second semiconductor pattern layers 121 in the same column are sequentially connected.

Figure 11:
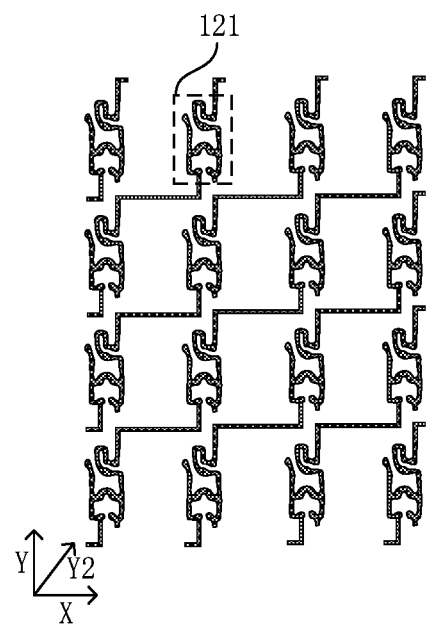
FIG. 11 is a schematic diagram illustrating connections of second semiconductor pattern layers provided by an embodiment of the present disclosure.

FIG. 11 is a schematic diagram of connections between the second semiconductor pattern layers provided by an embodiment of the present disclosure. As shown in FIG. 11, the second semiconductor pattern layers 121 are arranged along the fourth direction Y2 and connected to each other, and an angle included between the fourth direction Y2 and the first direction Y is not equal to 0°, that is, $90°>\alpha>0°$. Correspondingly, the effect of the sequential connection of the first semiconductor pattern layers 111 arranged along the third direction Y1 is basically the same as the effect of the sequential connection of the second semiconductor pattern layers 121 shown in FIG. 11, i.e., $90°>\beta>0°$.

It should be noted that the connection manners of the semiconductor pattern layers in all regions of the normal display region of the display panel can be consistent. In this way, on the one hand, the difficulty of design can be reduced, and on the other hand, the uniformity of the coupling capacitance of all semiconductor pattern layers can be reached.

In addition, the first semiconductor pattern layer 111 directly connected to one first semiconductor pattern layer 111 can be one of the first semiconductor pattern layers 111 located at both sides of the one first semiconductor pattern layer 111 along the third direction Y1, and can also be one first semiconductor pattern layer 111 located at least one side of the one first semiconductor pattern layer 111 along a direction intersecting the third direction Y1. Similarly, the second semiconductor pattern layer 121 directly connected to one second semiconductor pattern layer 121 can be one of the second semiconductor pattern layers 121 located at both sides of the one second semiconductor pattern layer 121 along the fourth direction Y2, and can also be one second semiconductor pattern layer 121 located at least one side of the one second semiconductor pattern layer 121 along a direction intersecting the fourth direction Y2.

In an embodiment, when the first semiconductor pattern layers 111 are arranged along the third direction Y1 and sequentially connected to each other, one, two or three first semiconductor pattern layers 111 are connected along the direction intersecting the third direction Y1. For example, two first semiconductor pattern layers 111 are connected along the direction intersecting the third direction Y1. In this way, the coupling capacitances formed between the first semiconductor pattern layers 111 can be reduced. Based on the same principle, one, two or three second semiconductor pattern layers 121 are connected along the direction intersecting the fourth direction Y2. For example, two second semiconductor pattern layers 121 are connected along the direction intersecting the fourth direction Y2.

In an embodiment of the present disclosure, as shown in FIG. 8 and FIG. 9, the first display region 11 is the specific display region, and the multiple pixel circuits DI in the first display region 11 are the first pixel circuits 110, and the semiconductor pattern layer of the first pixel circuit 110 in the display region 11 is the first semiconductor pattern layer 111. And at least one connecting semiconductor CL are provided in the functional region 02, and through the connecting semiconductor CL, the second semiconductor pattern layers 121 arranged along the fourth direction Y2 and connected to each other are electrically connected to the first semiconductor pattern layers 111 arranged along the third direction Y1 and connected to each other.

In an embodiment, as shown in FIG. 8, one connecting semiconductor CL is connected to multiple second semiconductor pattern layers 121 that are located in the second display region 12 and close to the functional region 02, and is also connected to multiple first semiconductor pattern layers 111 that are located in the first display region 11 and close to the functional region 02. In this way, the static electricity on the second semiconductor pattern layers 121 can be dispersed to the first semiconductor pattern layers 111 through a small number of connecting semiconductors CL.

In an embodiment, as shown in FIG. 8, the connecting semiconductor CL is connected to all the second semiconductor pattern layers 121 that located in the second display region 12 and close to the functional region 02, and is also connected to all the first semiconductor pattern layers 111 that are located in the first display region 11 and close to the functional region 02. That is, all the second semiconductor pattern layers 121 in the second display region 12 are directly or indirectly connected to the same connecting semiconductor CL, and all the first semiconductor pattern layers 111 in the first display region 11 are directly or indirectly connected to the same connecting semiconductor. The semiconductor CL is directly or indirectly connected to all the second semiconductor pattern layers 121 and all the first semiconductor pattern layers 111.

That is, a plurality of columns of first semiconductor pattern layers 111 along a direction perpendicular to the third direction Y1 is electrically connected to the same connecting semiconductor CL, and a plurality of columns of second semiconductor pattern layers 121 along a direction perpendicular to the fourth direction Y2 is also electrically connected the same connecting semiconductor CL. In this way, the static electricity on all the second semiconductor pattern layer 121 can be distributed to the first display region 11 and the second display region 12 that are located on both sides of the functional region 02. When a number of second semiconductor pattern layers 121 in each column is different from each other due to the irregular shape of the functional region 02, such design can achieve a better distribution of static electricity at both sides of the functional region 02.

In addition, since one connecting semiconductor CL is directly or indirectly connected to all the second semiconductor pattern layers 121 and all the first semiconductor pattern layers 111, only one connecting semiconductor CL is provided in the functional region 02, which simplifies the process and reduces the influence of the connecting semiconductor CL on the preparation process of the layer in the functional region 02.

In order to increase flow paths of the static electricity, two or more connecting semiconductors CL can be provided. When there are multiple connecting semiconductors CL, the multiple connecting semiconductors CL can be connected to each other.

Figure 12:
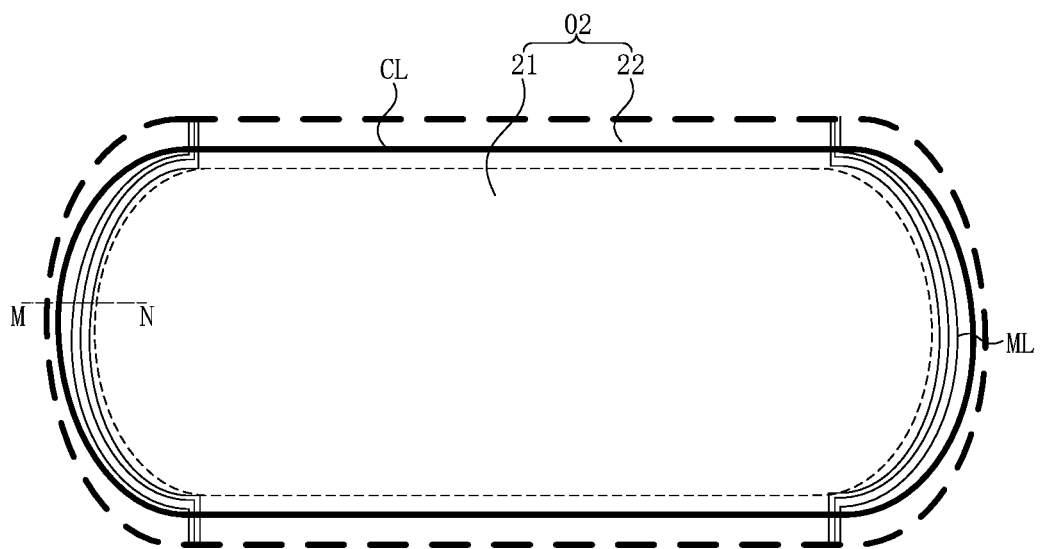
FIG. 12 is a schematic diagram of a functional region of a display panel provided by the present disclosure.
Figure 13:
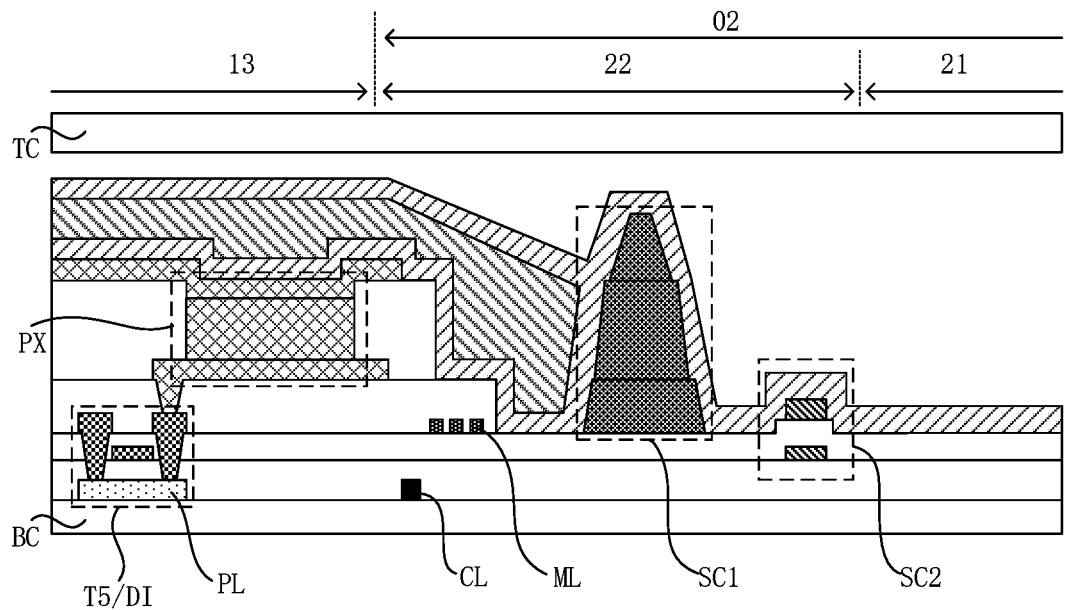
FIG. 13 is a cross-sectional view of a display panel shown in FIG. 12 along a direction MN.
Figure 14:
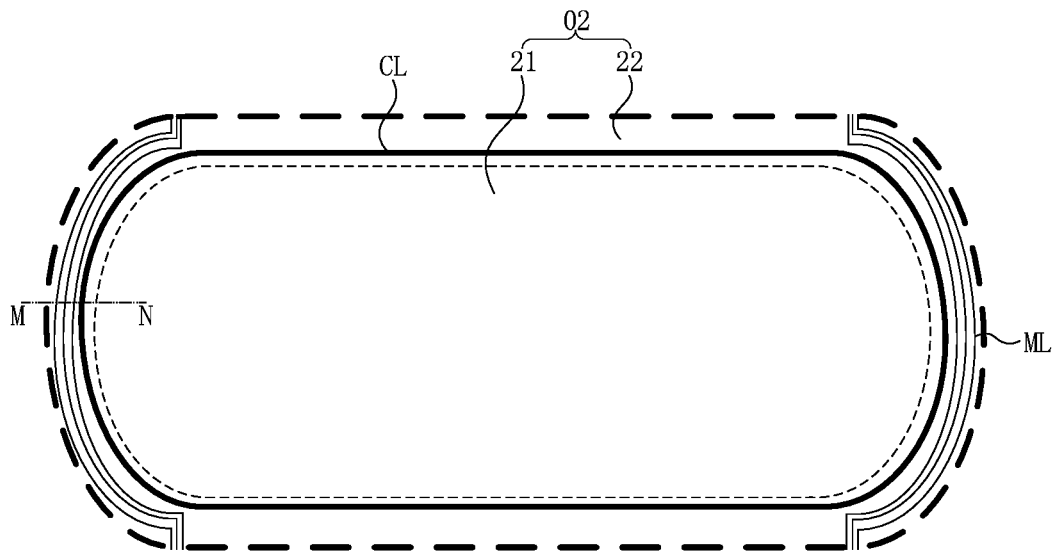
FIG. 14 is another schematic diagram of a functional region of a display panel provided by the present disclosure.
Figure 15:
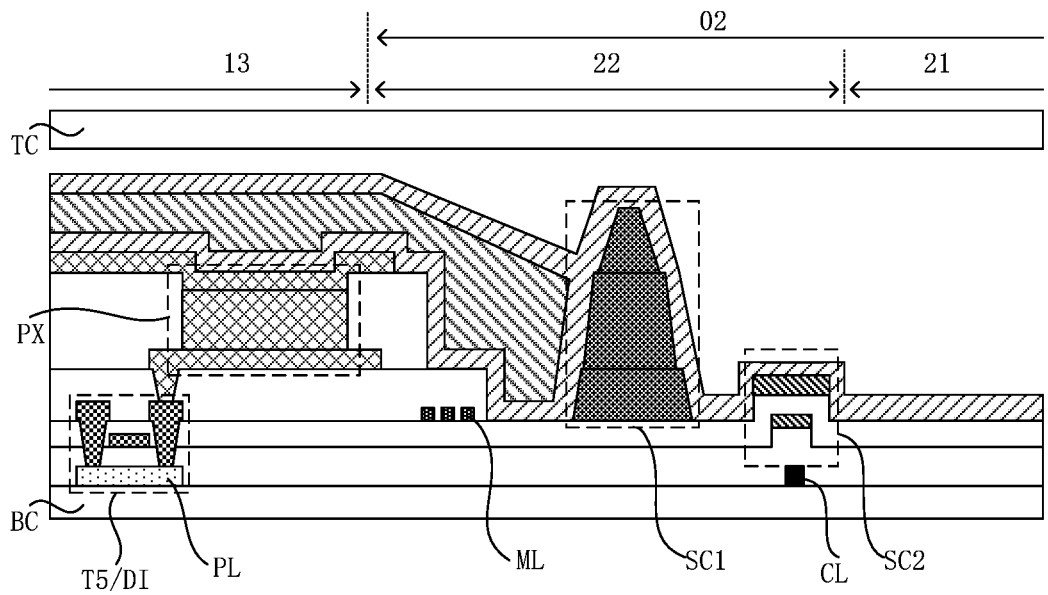
FIG. 15 is a cross-sectional view of a display panel shown in FIG. 14 along a direction MN.
Figure 16:
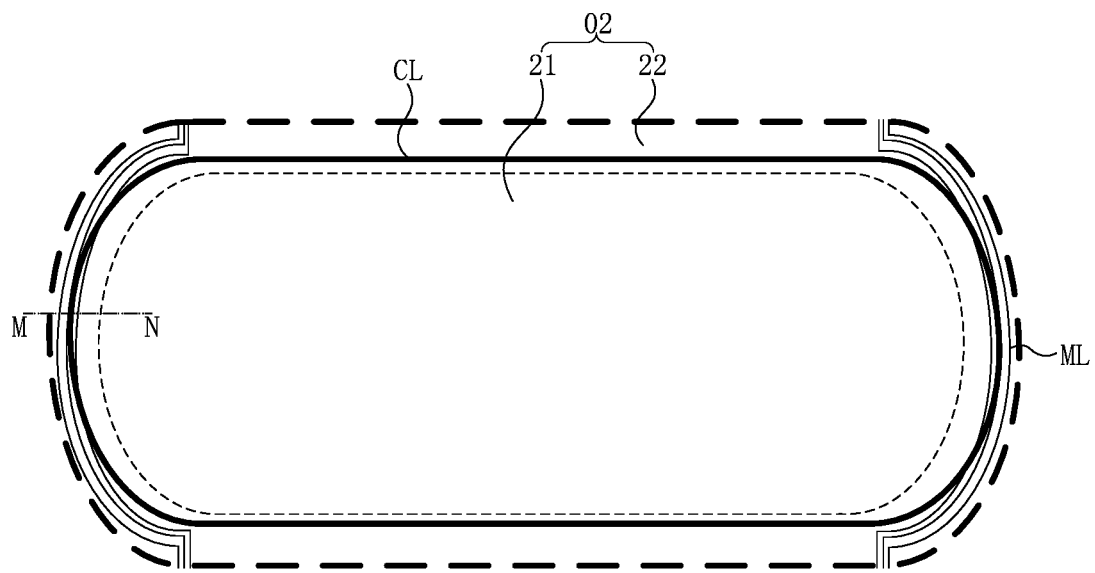
FIG. 16 is another schematic diagram of a functional region of a display panel provided by the present disclosure.
Figure 17:
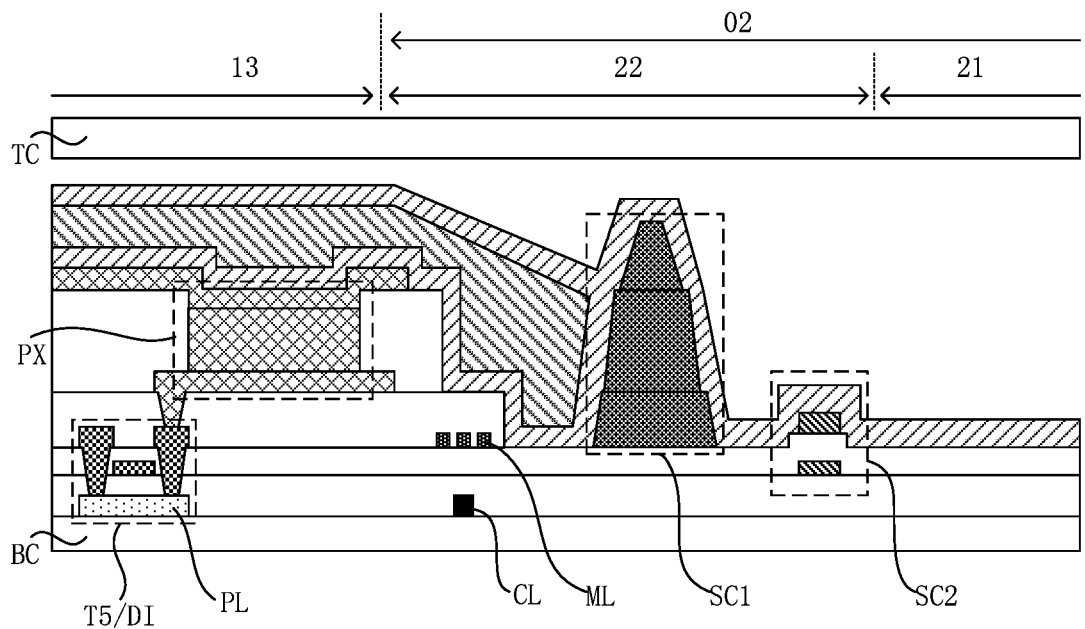
FIG. 17 is a cross-sectional view of a display panel shown in FIG. 16 along a direction MN.

FIG. 12 is a schematic diagram of the functional region of the display panel provided by the present disclosure, FIG. 13 is a cross-sectional view of the display panel shown in FIG. 12 along a direction MN, FIG. 14 is another schematic diagram of the functional region of the display panel provided by the present disclosure, FIG. 15 is a cross-sectional view of the display panel shown in FIG. 14 along a direction MN, FIG. 16 is another schematic diagram of the functional region of the display panel provided by the present disclosure, and FIG. 17 is a cross-sectional view of the display panel shown in FIG. 12 along a direction MN.

As shown in FIG. 12, FIG. 14 and FIG. 16, the functional region 02 includes a light-transmitting region 21 and a transition region 22 surrounding the light-transmitting region 21. In the light-transmitting region 21, light propagates through the display panel along a thickness direction of the display panel. The transition region 22 is arranged between the light-transmitting region 21 and the normal display region 01, and metal windings can be arranged in the transition region 22 instead of being provided in the light-transmitting region 21, thereby increasing the light transmittance of the light-transmitting region 21. When the light-transmitting region 21 is present, the normal display region 01 can be encapsulated at a peripheral position close to the light-transmitting region 21, and an encapsulating structure can be provided in the transition region 22.

As shown in FIG. 13, FIG. 15 and FIG. 17, in order to increase the light transmittance of the light-transmitting region 21, at least one layer in the normal display region 01 extends to the transition region 22 and then is ended with, for example, a planarization layer made of organic material, a pixel definition layer, and an organic layer of an encapsulating layer. In order to prevent water vapor, oxygen, etc. from invading the normal display region 01 through the light-transmitting region 21, a barrier structure is provided in the transition region 22, such as a first barrier structure SC1 and a second barrier structure SC2. The first barrier structure SC1 can be formed by stacking a structure in a same layer as a planarization layer and a structure in a same layer as a pixel definition layer that are separated from each other, and a surface of the first barrier structure SC1 can be provided with an inorganic material layer of the encapsulating layer. A layer outside the first barrier structure SC1 and close to the light-transmitting region 21 does not include a layer made of organic material, and thus a height of the first barrier structure SC1 is higher than a height of the layer outside the first barrier structure SC1 and close to the light-transmitting region 21, thereby lengthening the transmission path of water vapor and oxygen, and the first barrier structure SC1 can play a role in blocking water vapor and oxygen. The second barrier structure SC2 can be formed by stacking metals in the same layers as the signal lines in the normal display region 01, which can effectively block water vapor and oxygen.

In combination with FIG. 12 and FIG. 13, FIG. 14 and FIG. 15, as well as FIG. 16 and FIG. 17, since the light can propagate through light-transmitting region 21, the light-transmitting region 21 can have a higher light transmittance, and the metal wirings should be avoided being provided in the light-transmitting region 21. If the signal lines located in the normal display region 01 and at both sides of the functional region 02 are electrically connected to each other, they can be electrically connected through the metal wirings ML located in the transition region 22. Therefore, a metal wiring group is provided in the transition region 22 and includes multiple metal wirings ML. For example, as shown in FIG. 12 to FIG. 17, at each side of the functional region 02, three metal wirings ML are provided in the transition region 22. Moreover, as shown in FIG. 12 to FIG. 17, the metal wirings ML and the connecting semiconductor CL can be arranged in different layers.

In combination with FIG. 12 and FIG. 13, FIG. 14 and FIG. 15, as well as FIG. 16 and FIG. 17, at least one connecting semiconductor CL is provided in the transition region 22. Although the connecting semiconductor CL connects the semiconductor pattern layers located in the normal display region 01, it is avoided that the connecting semiconductor CL affects the configuration of the pixel circuits DI located in the normal display region 01 by arranging the connecting semiconductor CL in the transition region 22. In addition, the light-transmission of the light-transmitting region 02 is prevented from being affected by arranging the connecting semiconductor CL in the transition region 22.

In an embodiment, referring to FIG. 12 and FIG. 13, an orthographic projection of the connecting semiconductor CL on a plane of the display panel is arranged at a side, facing away from the light-transmitting region 21, of an orthographic projection of the metal wiring group on the plane of the display panel. That is, the connecting semiconductor CL is disposed at a part of the transition region 22 close to the normal display region 01, which facilities the connection of the connecting semiconductor CL to the semiconductor pattern layer. In addition, the connecting semiconductor CL is space apart from the metal wiring group to ensure that the layer under the metal wiring group is a planarization layer, which reduces the design difficulty of the metal wiring ML and the risk of disconnection of the metal wirings. In addition, basically no parasitic capacitance and signal crosstalk will occur between the metal wiring ML and the connecting semiconductor CL.

In another embodiment, referring to FIG. 14 and FIG. 15, the orthographic projection of the connecting semiconductor CL on the plane of the display panel is arranged at a side, close to the light-transmitting region 21, of the orthographic projection of the metal wiring group on the plane of the display panel. And along the thickness direction of the display panel, the connecting semiconductor CL is arranged under the first barrier structure SC1 and/or the second barrier structure SC2, thereby lengthening the path of the first barrier structure SC1 and/or the second barrier structure SC2 for blocking water vapor and oxygen. In addition, the connecting semiconductor CL is arranged at a position far away from the metal wiring group to ensure that the layer under the metal wiring group is a planarization layer, thereby reducing the design difficulty of the metal wiring ML and the risk of disconnection of the metal wirings. In addition, basically no parasitic capacitance and signal crosstalk will occur between the metal wiring ML and the connecting semiconductor CL.

In another embodiment, referring to FIG. 16 and FIG. 17, in a thickness direction of the display panel, the metal wiring group at least partially covers the connecting semiconductor CL. That is, as shown in FIG. 17, along the thickness direction of the display panel, the connecting semiconductor CL is disposed under the metal wiring group and the metal wiring group completely covers the connecting semiconductor CL. Since the lengths of the first display region 11 and the second display region 12 are smaller than the length of the third display region 13, along the first direction Y, a number of positions where the interconnected semiconductor pattern layers in the first display region 11 and the second display region 12 intersect the signal lines is smaller than a number of positions where the interconnected semiconductor pattern layer in the third display regions 13 intersect the signal lines. By arranging the connecting semiconductor CL under the metal wiring group, the number of positions where the interconnected semiconductor pattern layers in the first display region 11 and the second display region 12 intersect the signal lines is increased to balance the coupling capacitance between the semiconductor pattern layer in the normal display region 01 and the signal line.

As shown in FIG. 12 to FIG. 17, the density of sub-pixels in the light-transmitting region 21 is 0, that is, no sub-pixels PX is arranged in the light-transmitting region 21 and the light-transmitting region 21 is not used for light-emitting display.

In an embodiment, as shown in FIG. 13, FIG. 15 and FIG. 17, the light-transmitting region 21 is a non-hollowed region of the display panel. That is, the display panel includes a first substrate BC and a second substrate TC that are opposite to each other, and both the first substrate BC and the second substrate TC have a continuous structure in the light-transmitting region 21 and the normal display region 01.

Figure 18:
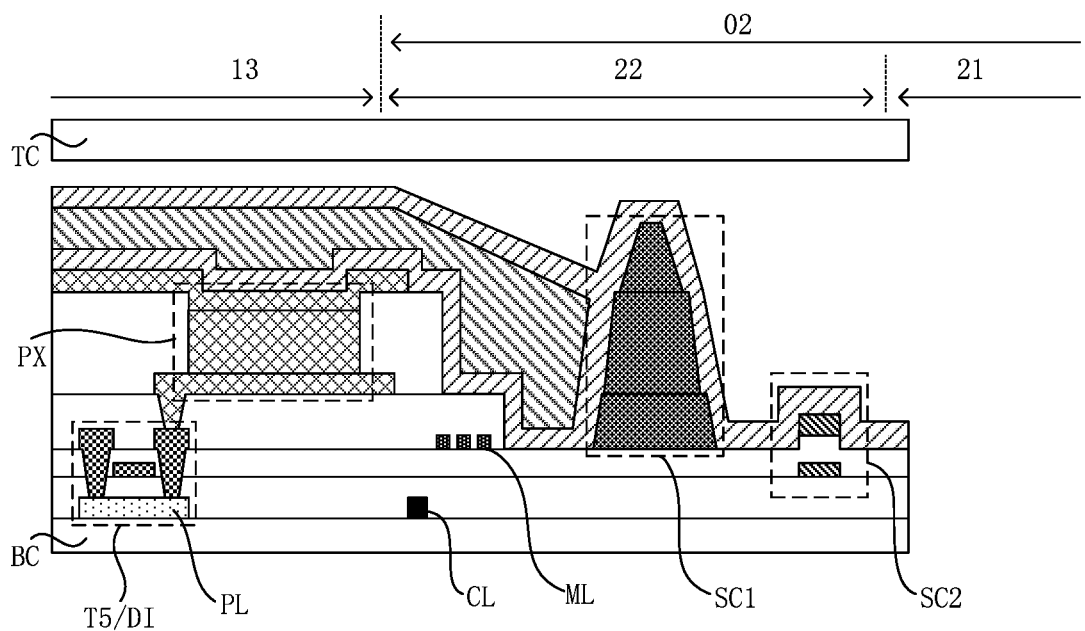
FIG. 18 is another cross-sectional view of a display panel shown in FIG. 12 along a direction MN.

In another embodiment, the light-transmitting region 21 is a hollow region of the display panel. FIG. 18 is another cross-sectional view of the display panel shown in FIG. 12 along the direction MN. As shown in FIG. 18, the display panel includes a first substrate BC and a second substrate TC opposite to the first substrate BC, and both the first substrate BC and the second substrate TC are hollow in the light-transmitting region 21. It should be noted that FIG. 18 only illustrates one embodiment in which the connecting semiconductor CL is located at a side of the transition region 22 facing away from the light-transmitting region 21, but in this embodiment, the structure of the transition region 22 can be the same as any one of the above embodiments.

Figure 19:
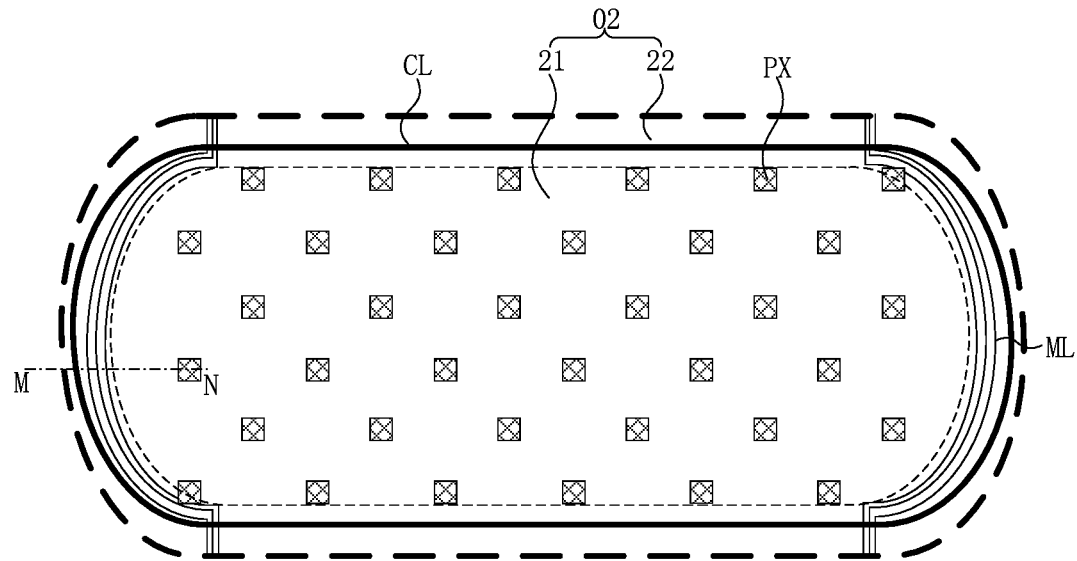
FIG. 19 is yet another schematic diagram of a functional region of a display panel provided by the present disclosure.
Figure 20:
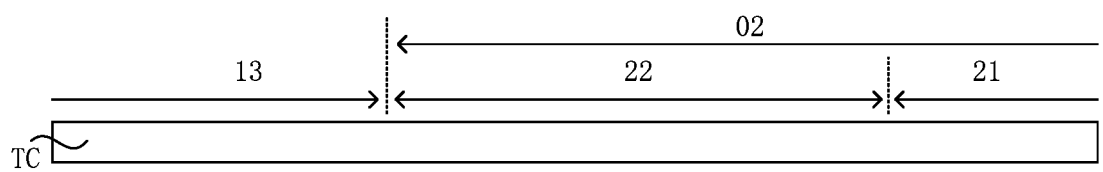
FIG. 20 is a cross-sectional view of a display panel shown in FIG. 19 along a direction MN.
Figure 20:
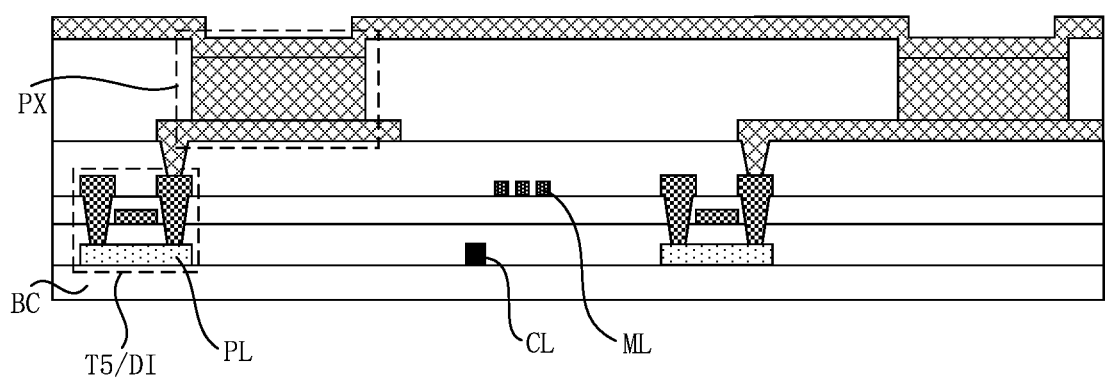

FIG. 19 is another schematic diagram of the functional region of the display panel provided by the present disclosure, and FIG. 20 is a cross-sectional view of a display panel shown in FIG. 19 along the direction MN. As shown in FIG. 19 and FIG. 20, the density of the sub-pixels in the light-transmitting region 21 is greater than zero, that is, the light-transmitting region 21 also has a function of light-emitting display, thereby increasing the display region of the display panel. In an embodiment, the sub-pixels PX are also arranged in the transition region 22, and the normal display region 01 and the functional region 02 of the display panel can display continuous pictures. The pixel circuit DI and the metal winding are arranged in the transition region 22 instead of being arranged in the light-transmitting region 21, thereby increasing the light transmittance of the light-transmitting region 21. It should be noted that the pixel circuit DI configured to provide signals to the sub-pixel PX located in the light-transmitting region 21 can be arranged in the transition region 21.

When the sub-pixels PX are arranged in the light-transmitting region 21, the connecting semiconductor CL and the metal wiring group can be arranged in the transition region 22 in the same manner as any one of the foregoing embodiments, which will not be repeated herein.

In an embodiment, as shown in FIG. 12, FIG. 14, FIG. 16, and FIG. 19, the connecting semiconductor CL is a ring structure surrounding the light-transmitting region 21, so as to utilize the least connecting semiconductor CL to connect the first semiconductor pattern layer 111 and the second semiconductor pattern layer 112 that are close to the light-transmitting region 21, and prevent the connecting semiconductor CL from affecting the arrangement of the signal lines in the transition region 22 or affecting the barrier structure. The number of connecting semiconductor CL can be at least one.

In addition, it should be noted that in this embodiment, the connecting semiconductor CL has a ring structure, which means that the connecting semiconductor CL has a continuous structure and its overall outline is a ring. The connecting semiconductor CL can further include a protrusion structure configured to connect the first semiconductor pattern layers 111 and the second semiconductor pattern layers 121, but the overall contour of the connecting semiconductor CL is still ring-shaped.

In another embodiment, as shown in FIG. 9, one end of the connecting semiconductor CL is connected to a second semiconductor pattern layer 121 close to the functional region 02 and located in the second display region 12, and the other end of the connecting semiconductor CL is connected to a first semiconductor pattern layer 111 close to the functional region 02 and located in the display region. Thus, through the connecting semiconductor CL, the second semiconductor pattern layers 121 connected to each other in the second display region 12 are connected to the first semiconductor pattern layers 111 connected to each other in the first display region 11. The first semiconductor pattern layers 111 and the second semiconductor pattern layers 121 that are located in the same column are connected to each other, and the semiconductor pattern layers located in the same column in the third display region 13 are sequentially connected to each other, that is, the connection manner of the semiconductor pattern layers in the display regions located at both sides of the functional region 02 is basically the same as the connection manner of the semiconductor pattern layers located in other display regions, ensuring the basically same static electricity and capacitive coupling in the semiconductor pattern layers in the normal display region 01, and ensuring the display uniformity.

It should be noted that, the present embodiment only differs from any one of the foregoing embodiments in the shape of the connecting semiconductor CL as well as the connection of the connecting semiconductor CL to the first semiconductor pattern layer 111 and the second semiconductor pattern layer 121, and other structural designs are the same, which will not be repeated herein.

In an embodiment of the present disclosure, as shown in FIG. 10, the third display region 13 is the specific display region, and the plurality of pixel circuits DI in the third display region 13 is the first pixel circuits 110, and the semiconductor pattern layer of the first pixel circuit 110 located in the third display region 13 is the first semiconductor pattern layer 111.

In an embodiment, the display panel further includes a semiconductor connection region disposed at a side of the second display region 12 facing away from the functional region 02 along the first direction Y, and one connecting semiconductor CL is provided in the connection semiconductor region. Along the first direction Y, the second semiconductor pattern layers 121 close to the semiconductor connection region in the second display region 12 are all connected to one connecting semiconductor CL, and the first semiconductor pattern layers 111 in the third display region 13 are all connected to one connecting semiconductor CL. And a number of the first semiconductor pattern layers 111 connected to the same connecting semiconductor CL is greater than a number of the second semiconductor pattern layers 121 connected to the same connecting semiconductor CL.

In this way, the static electricity in the second semiconductor pattern layer 121 during the manufacturing process can be distributed to the first semiconductor pattern layers 111 via the connecting semiconductor CL, which avoids display abnormalities in the second display region 11. At the same time, the number of the first semiconductor pattern layers 111 sequentially connected along the third direction Y1 in the third display region 13 is much greater than the number of the second semiconductor pattern layers 121 sequentially connected along the fourth direction Y2, and a column number of the first semiconductor pattern layers 111 arranged in the direction Y1 is also much greater than a column number of columns of the second semiconductor pattern layers 121 arranged in the direction perpendicular to the first direction Y1. Therefore, the static electricity in the second semiconductor pattern layer 121 can be sufficiently distributed.

In an embodiment, as shown in FIG. 10, along the first direction Y, all the second semiconductor pattern layers 121 close to the semiconductor connection region in the second display region 12 are connected to one connecting semiconductor CL, and all the first semiconductor pattern layers 111 close to the semiconductor connection region in the three display region 13 are connected to one connecting semiconductor CL.

The semiconductor connection region can be at an edge region of the normal display region 01 or in the non-display region outside the normal display region 01, which can prevent the connecting semiconductor CL from affecting the arrangement of the semiconductor pattern layer in the normal display region 01.

In an embodiment, the pixel circuit semiconductor pattern layers in different columns in the first display region 11 are not connected to each other in the second direction.

In an embodiment, the connecting semiconductor CL can be arranged in the same layer as the semiconductor pattern layer, and thus they can be prepared at the same time, reducing the process complexity.

It should be noted that the position of the connecting semiconductor CL and the position of the first semiconductor pattern layer 111 in this embodiment are different from the above-mentioned embodiments, and other structural designs can be the same as any one of the above-mentioned embodiments, and will not be repeated herein.

In addition, along the thickness direction of the display panel, the connecting semiconductor CL can also be disposed under the semiconductor pattern layer, and a planarization layer can be provided between the connecting semiconductor and the semiconductor pattern layer, and a via hole can be provided in the planarization layer. That is, the connecting semiconductor is prepared before the semiconductor pattern layer is prepared, and during the manufacturing process of the semiconductor pattern layer, the semiconductor pattern layer and the connecting semiconductor are connected through the via hole. In an embodiment, the conductivity of the connected semiconductor can be better than that of the semiconductor pattern layer, which facilitates the dispersion of static electricity.

Figure 21:
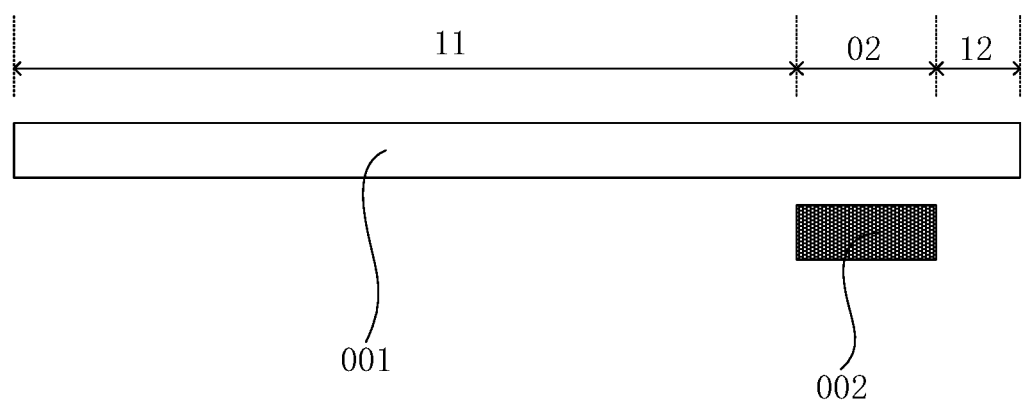
FIG. 21 is a schematic diagram of a display apparatus provided by an embodiment of the present disclosure.

FIG. 21 is a schematic diagram of a display apparatus provided by an embodiment of the present disclosure. As shown in FIG. 21, the display apparatus includes a display panel 001 according to any one of the above embodiments. The display apparatus provided in the embodiment of the present disclosure can be a mobile phone. The display apparatus provided in the embodiment of the present disclosure can also be a display apparatus such as a computer or a television.

As shown in FIG. 21, the display apparatus provided by an embodiment of the present disclosure further includes an optical device 002, and the optical device 002 is disposed at a position of the display apparatus corresponding to the functional region 02 of the display panel 001. That is, along the thickness direction of the display panel 001, the optical device 002 is disposed under the functional region 02 of the display panel 001. The optical device 002 can emit light to the light-exiting surface of the display panel 001 through the functional region 02, or can receive light from the light-exiting surface of the display panel 001 through the functional region 02. The optical device can be at least one of an optical fingerprint sensor, an iris recognition sensor, a camera, or a flashlight.

In the present disclosure, by connecting the second semiconductor pattern layers 121 to the first semiconductor pattern layer 111, the continuity of the semiconductor pattern layer in the functional region 02 is ensured, which reduces the risk of the static electricity flowing into the semiconductor pattern layer located in the functional region 02. At the same time, the second semiconductor pattern layers 121 connected in series and the first semiconductor pattern layers 111 connected in series are connected together, and the denser static electricity in the second semiconductor pattern layer 121 is distributed to the first semiconductor pattern layers 111 and the second semiconductor pattern layers 111, achieving the uniform distribution of the static electricity in the semiconductor pattern layer. In this way, the reliability and uniformity of the performance of the semiconductor pattern layer in the subsequent high-temperature manufacturing process can be improved, so that the driving ability of each pixel circuit is basically the same, ensuring the display uniformity of the display panel.

The above only illustrates some embodiments and does not limit the technical solutions of the present disclosure. Any modification, equivalent replacement, improvement, etc. made within the spirit and principle of this disclosure shall fall within the scope of disclosure.

What is claimed is:
1. A display panel, comprising:
a normal display region comprising a first display region, a second display region and a third display region; and
a functional region,
wherein along a first direction, a length of the second display region is smaller than a length of the first display region and smaller than a length of the third display region, and the length of the first display region is smaller than the length of the third display region, wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction, wherein the first display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies $90°>α≥0°$, wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$, wherein the plurality of second semiconductor pattern layers that is arranged along the fourth direction and connected to each other is connected to the plurality of first semiconductor pattern layers that is arranged along the third direction and connected to each other, and wherein one second semiconductor pattern layer of the plurality of second semiconductor pattern layers that is located in the second display region is, by the functional region, spaced apart from one first semiconductor pattern layer of the plurality of first semiconductor pattern layers that is located in the specific display region, and the one second semiconductor pattern layer is connected to the one first semiconductor pattern layer and the functional region comprises a light-transmitting region and a transition region surrounding the light-transmitting region;

wherein at least one connecting semiconductor is provided in the transition region, and through the at least one connecting semiconductor, the plurality of second semiconductor pattern layers that is arranged along the fourth direction and connected to each other is connected to the plurality of first semiconductor pattern layers that is arranged along the third direction and connected to each other; and wherein each of the at least one connecting semiconductor is connected to at least two of the plurality of second semiconductor pattern layers that are located in the second display region and adjacent to the functional region, and connected to at least two of the plurality of first semiconductor pattern layers that are located in the first display region and adjacent to the functional region.

2. The display panel according to claim 1, wherein a metal wiring group is provided in the transition region, and comprises a plurality of metal wirings.

3. The display panel according to claim 2, wherein in a thickness direction of the display panel, the metal wiring group covers the at least one connecting semiconductor.

4. The display panel according to claim 1, wherein a density of sub-pixels located in the light-transmitting region is zero.

5. The display panel according to claim 4, wherein the light-transmitting region is a hollow region of the display panel.

6. The display panel according to claim 4, wherein the light-transmitting region is a non-hollowed region of the display panel.

7. The display panel according to claim 1, wherein a density of sub-pixels located in the light-transmitting region is greater than zero.

8. The display panel according to claim 1, wherein a number of second pixel circuits of the plurality of second pixel circuits arranged along the first direction in the second display region is M, and a number of first pixel circuits of the plurality of first pixel circuits arranged along the first direction in the specific display region is N, where both M and N are positive integers greater than or equal to 2, and satisfy $50≥N/M≥12$.

9. The display panel according to claim 1, wherein the plurality of first semiconductor pattern layers and the plurality of second semiconductor pattern layers are each made of polysilicon or metal oxide semiconductor.

10. A display panel, comprising:

a normal display region comprising a first display region, a second display region and a third display region; and a functional region, wherein along a first direction, a length of the second display region is smaller than a length of the first display region and smaller than a length of the third display region, and the length of the first display region is smaller than the length of the third display region, wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction, wherein the first display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies $90°>α≥0°$, wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$, wherein the plurality of second semiconductor pattern layers that is arranged along the fourth direction and connected to each other is connected to the plurality of first semiconductor pattern layers that is arranged along the third direction and connected to each other, and wherein one second semiconductor pattern layer of the plurality of second semiconductor pattern layers that is located in the second display region is, by the functional region, spaced apart from one first semiconductor pattern layer of the plurality of first semiconductor pattern layers that is located in the specific display region, and the one second semiconductor pattern layer is connected to the one first semiconductor pattern layer, and the functional region comprises a light-transmitting region and a transition region surrounding the light-transmitting region;

wherein at least one connecting semiconductor is provided in the transition region, and through the at least one connecting semiconductor, the plurality of second semiconductor pattern layers that is arranged along the fourth direction and connected to each other is connected to the plurality of first semiconductor pattern layers that is arranged along the third direction and connected to each other;

wherein a metal wiring group is provided in the transition region, and comprises a plurality of metal wirings; and wherein an orthographic projection of the at least one connecting semiconductor on a plane of the display panel is located at a side, facing away from the light-transmitting region, of an orthographic projection of the metal wiring group on the plane of the display panel.

11. A display panel, comprising:

a normal display region comprising a first display region, a second display region and a third display region; and a functional region, wherein along a first direction, a length of the second display region is smaller than a length of the first display region and smaller than a length of the third display region, and the length of the first display region is smaller than the length of the third display region, wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction, wherein the first display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies $90°>α≥0°$, wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$, wherein the plurality of second semiconductor pattern layers that is arranged along the fourth direction and connected to each other is connected to the plurality of first semiconductor pattern layers that is arranged along the third direction and connected to each other, and wherein one second semiconductor pattern layer of the plurality of second semiconductor pattern layers that is located in the second display region is, by the functional region, spaced apart from one first semiconductor pattern layer of the plurality of first semiconductor pattern layers that is located in the specific display region, and the one second semiconductor pattern layer is connected to the one first semiconductor pattern layer, and the functional region comprises a light-transmitting region and a transition region surrounding the light-transmitting region;

wherein at least one connecting semiconductor is provided in the transition region, and through the at least one connecting semiconductor, the plurality of second semiconductor pattern layers that is arranged along the fourth direction and connected to each other is connected to the plurality of first semiconductor pattern layers that is arranged along the third direction and connected to each other;

wherein a metal wiring group is provided in the transition region, and comprises a plurality of metal wirings; and wherein an orthographic projection of the at least one connecting semiconductor on a plane of the display panel is located at a side, adjacent to the light-transmitting region, of an orthographic projection of the metal wiring group on the plane of the display panel.

12. A display panel, comprising:

a normal display region comprising a first display region, a second display region and a third display region; and a functional region, wherein along a first direction, a length of the second display region is smaller than a length of the first display region and smaller than a length of the third display region, and the length of the first display region is smaller than the length of the third display region, wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction, wherein the third display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies $90°>α≥0°$, wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$, wherein the plurality of second semiconductor pattern layers that is arranged along the fourth direction and connected to each other is connected to the plurality of first semiconductor pattern layers that is arranged along the third direction and connected to each other;

the display panel further comprises a semiconductor connection region arranged at a side of the second display region facing away from the functional region along the first direction;

at least one connecting semiconductor is provided in the semiconductor connection region;

one of the at least one connecting semiconductor is connected to at least two of the plurality of second semiconductor pattern layers that are located in the second display region and adjacent to the semiconductor connection region, and connected to the plurality of first semiconductor pattern layers that are located in the third display region; and a number of the plurality of first semiconductor pattern layers connected to the one connecting semiconductor is greater than a number of the at least two of the plurality of second semiconductor pattern layers connected to the one connecting semiconductor.

13. The display panel of claim 12, wherein along the first direction, the one of the at least one connecting semiconductor is connected to all second semiconductor pattern layers adjacent to the semiconductor connection region of the plurality of second semiconductor pattern layers in the second display region, and is connected to all first semiconductor pattern layers adjacent to the semiconductor connection region of the plurality of first semiconductor pattern layers in the third display region.

14. A display apparatus, comprising:
an optical device; and
a display panel,
wherein the display panel comprises:
a normal display region comprising a first display region, a second display region, and a third display region; and
a functional region,
wherein along a first direction, a length of the second display region is smaller than a length of the first display region and smaller than a length of the third display region, and the length of the first display region is smaller than the length of the third display region,
wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction,
wherein the first display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies 90°>α≥0°,
wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies 90°>β≥0°,
wherein the plurality of second semiconductor pattern layers that is arranged along the fourth direction and connected to each other is connected to the plurality of first semiconductor pattern layers that is arranged along the third direction and connected to each other, wherein one second semiconductor pattern layer of the plurality of second semiconductor pattern layers that is located in the second display region is, by the functional region, spaced apart from one first semiconductor pattern layer of the plurality of first semiconductor pattern layers that is located in the specific display region, and the one second semiconductor pattern layer is connected to the one first semiconductor pattern layer, and the functional region comprises a light-transmitting region and a transition region surrounding the light-transmitting region;

wherein at least one connecting semiconductor is provided in the transition region, and through the at least one connecting semiconductor, the plurality of second semiconductor pattern layers that is arranged along the fourth direction and connected to each other is connected to the plurality of first semiconductor pattern layers that is arranged along the third direction and connected to each other;

wherein each of the at least one connecting semiconductor is connected to at least two of the plurality of second semiconductor pattern layers that are located in the second display region and adjacent to the functional region, and connected to at least two of the plurality of first semiconductor pattern layers that are located in the first display region and adjacent to the functional region; and wherein the optical device is arranged at a position of the display apparatus corresponding to the functional region.

15. The display apparatus according to claim 14, wherein a number of second pixel circuits of the plurality of second pixel circuits arranged along the first direction in the second display region is M, and a number of first pixel circuits of the plurality of first pixel circuits arranged along the first direction in the specific display region is N, where both M and N are positive integers greater than or equal to 2, and satisfy 50≥N/M≥12.

16. The display apparatus according to claim 14, wherein the optical device comprises at least one of an optical fingerprint sensor, an iris recognition sensor, a camera, or a flashlight.

17. A display apparatus, comprising:
an optical device; and
a display panel,
wherein the display panel comprises:
a normal display region comprising a first display region, a second display region, and a third display region; and
a functional region,
wherein along a first direction, a length of the second display region is smaller than a length of the first display region and smaller than a length of the third display region, and the length of the first display region is smaller than the length of the third display region,
wherein a density of sub-pixels located in the functional region is smaller than a density of sub-pixels located in the normal display region; the second display region, the functional region, and the first display region are sequentially adjacent to each other along the first direction; the functional region and at least one of the first display region or the second display region are adjacent to the third display region along a second direction, and the first direction intersects the second direction, wherein third display region is a specific display region, a plurality of first pixel circuits is located in the specific display region, a plurality of first semiconductor pattern layers is provided in the plurality of first pixel circuits, the plurality of first semiconductor pattern layers is arranged along a third direction and connected to each other, and a first angle α included between the third direction and the first direction satisfies $90°>α≥0°$, wherein a plurality of second pixel circuits is located in the second display region, a plurality of second semiconductor pattern layers is provided in the plurality of second pixel circuits in one-to-one correspondence, the plurality of second semiconductor pattern layers is arranged along a fourth direction and connected to each other, a second angle β included between the fourth direction and the first direction satisfies $90°>β≥0°$, wherein the plurality of second semiconductor pattern layers that is arranged along the fourth direction and connected to each other is connected to the plurality of first semiconductor pattern layers that is arranged along the third direction and connected to each other, wherein the optical device is arranged at a position of the display apparatus corresponding to the functional region, wherein the display panel further comprises a semiconductor connection region arranged at a side of the second display region facing away from the functional region along the first direction, wherein at least one connecting semiconductor is provided in the semiconductor connection region, wherein one of the at least one connecting semiconductor is connected to at least two of the plurality of second semiconductor pattern layers that are located in the second display region and adjacent to the semiconductor connection region, and connected to the plurality of first semiconductor pattern layers that are located in the third display region, and wherein a number of the plurality of first semiconductor pattern layers connected to the one connecting semiconductor is greater than a number of the at least two of the plurality of second semiconductor pattern layers connected to the one connecting semiconductor.

* * * * *